United States Patent
Ruha et al.

(10) Patent No.: US 6,445,318 B1
(45) Date of Patent: Sep. 3, 2002

(54) METHOD AND APPARATUS FOR PROVIDING SIGNAL DEPENDENT DITHER GENERATOR FOR SIGMA-DELTA MODULATOR

(75) Inventors: Antti Ruha; Tarmo Ruotsalainen; Jussi-Pekka Tervaluoto, all of Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/826,642

(22) Filed: Apr. 5, 2001

(51) Int. Cl.[7] ................................................. H03M 1/20

(52) U.S. Cl. ........................ 341/131; 341/143; 341/155; 341/139; 341/156

(58) Field of Search ................................. 341/131, 143, 341/144, 139, 77, 156

(56) References Cited

U.S. PATENT DOCUMENTS

| | | | |
|---|---|---|---|
| 5,144,308 A | * 9/1992 | Norsworthy et al. | 341/131 |
| 5,745,061 A | * 4/1998 | Norsworthy et al. | 341/131 |
| 5,889,482 A | 3/1999 | Zarubinsky et al. | |
| 5,990,815 A | * 11/1999 | Linder et al. | 341/131 |
| 5,990,819 A | 11/1999 | Fujimori | |
| 6,011,501 A | 1/2000 | Gong et al. | |
| 6,087,969 A | 7/2000 | Stockstad et al. | |
| 6,326,911 B1 | 12/2001 | Gomez et al. | 341/143 |

OTHER PUBLICATIONS

Multibit Σ–Δ A/D Converter Incorporating A Novel Class of Dynamic Element Matching Techniques; Leung, Bosco H et al; IEEE Transcations on Circuits and Systems II Analog and Digital Signal Processing, vol. 39 No.1; Jan. 1992.

Linearity Enhancement of Multibit ΔΣ A/D and D/A Converters Using Data Weighted Averaging; baird, Rex T. et al; IEEE Transactions on Circuits and Systems II Analog and Digital Signal Processing, vol. 42 No. 12; Dec. 1995.

A Noise–Shaping Coder Topology for 15+ Bit Converters; Carley, L. Richard; IEEE Journal of Solid–State Circuits, vol. 24, No. 2; Apr. 1989.

* cited by examiner

Primary Examiner—Michael Tokar
Assistant Examiner—Lam T. Mai
(74) Attorney, Agent, or Firm—Harrington & Smith, LLP

(57) ABSTRACT

A method is disclosed for operating a sigma-delta modulator of a type that includes a loop filter followed by a quantizer, as is a sigma-delta modulator that operates in accordance with the method. The method includes steps of (a) sampling an amplitude of an input signal to the loop filter; and (b) generating a dither current signal for summation with a quantizer current signal, where the dither current signal is generated to have a pseudorandom amplitude that is modulated so as to be inversely proportional to the sampled amplitude of the input signal. The step of generating operates at least one linear feedback shift register to control the on and off states of a plurality of current sources forming a DAC and, hence, the amplitude of the dither current signal, and may further select the polarity of the dither current signal. In one embodiment the step of sampling operates a plurality of window detectors in parallel, and the dither current signal is amplitude modulated in a plurality of predetermined quantized steps that are a function of the number of window detectors. In another embodiment the step of sampling generates a current with a value that represents a square of the magnitude of the sampled input signal, subtracts the current from a reference current to obtain a difference current, and amplitude modulates the dither current signal using the difference current. Also disclosed are techniques for shaping a spectrum of the dither signal so as to reduce in-band noise.

19 Claims, 8 Drawing Sheets

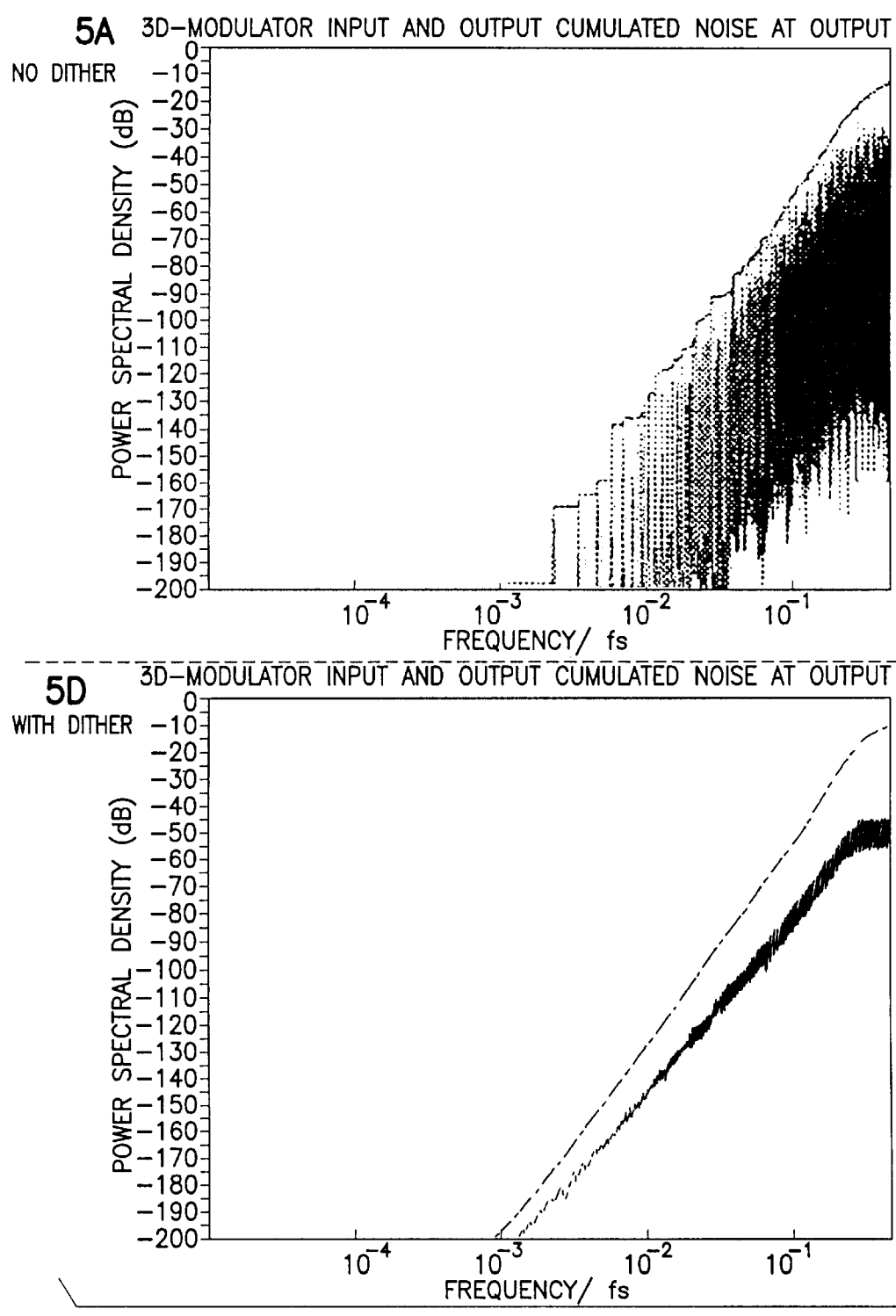

WITH SIGNAL
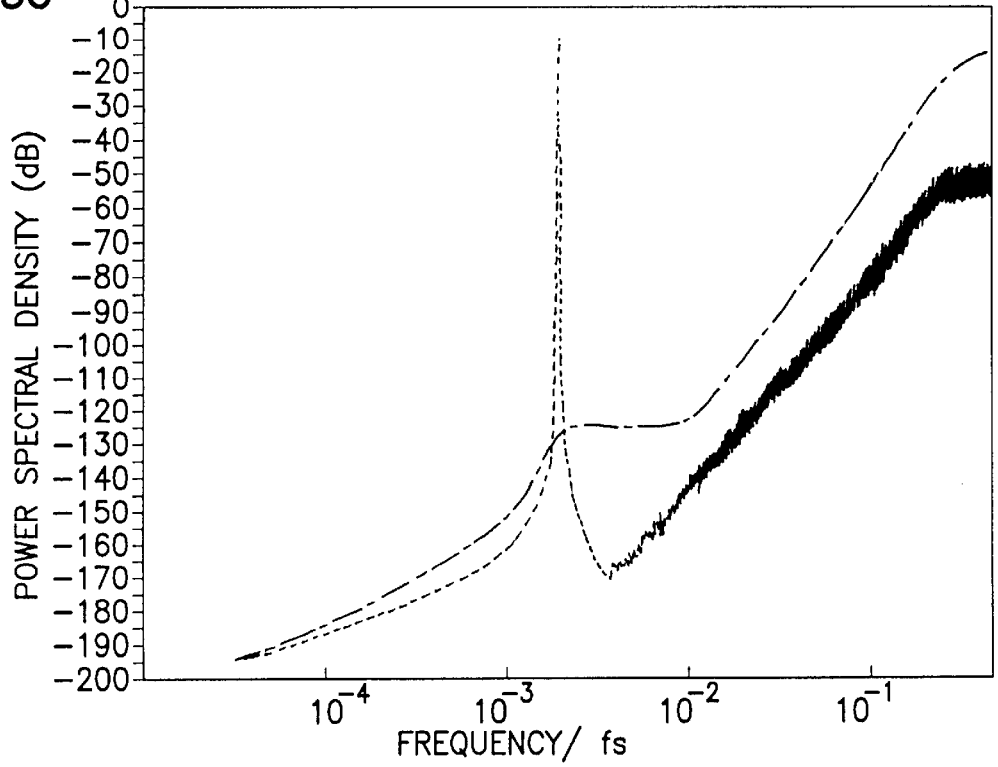
5C 3D-MODULATOR INPUT AND OUTPUT CUMULATED NOISE AT OUTPUT
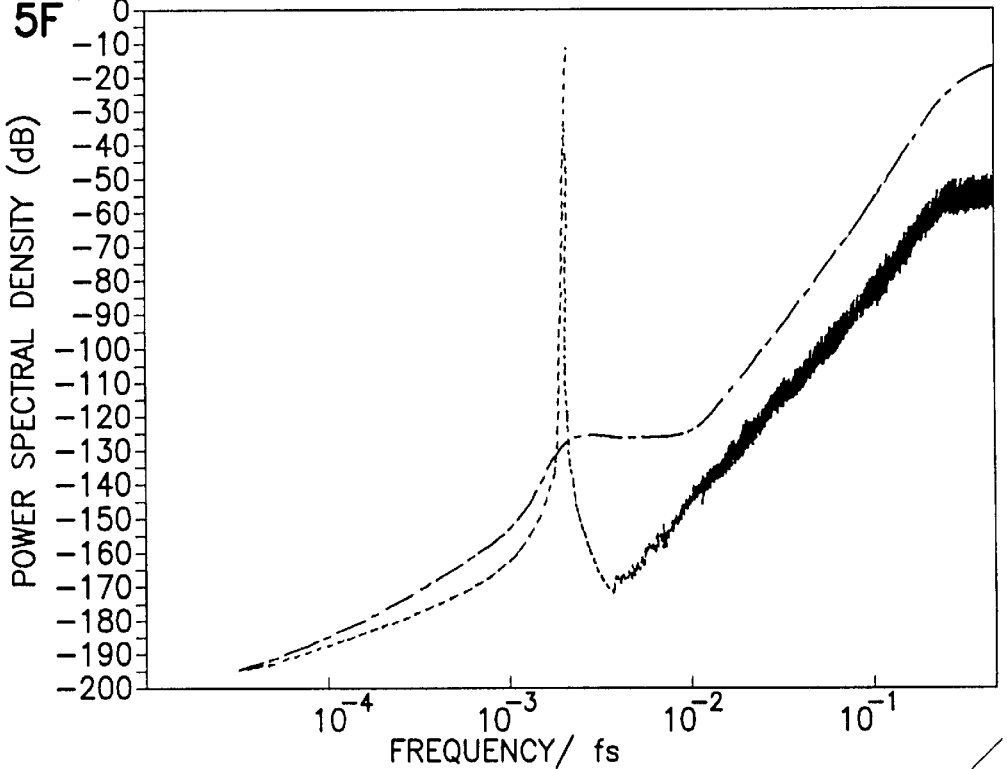
5F 3D-MODULATOR INPUT AND OUTPUT CUMULATED NOISE AT OUTPUT

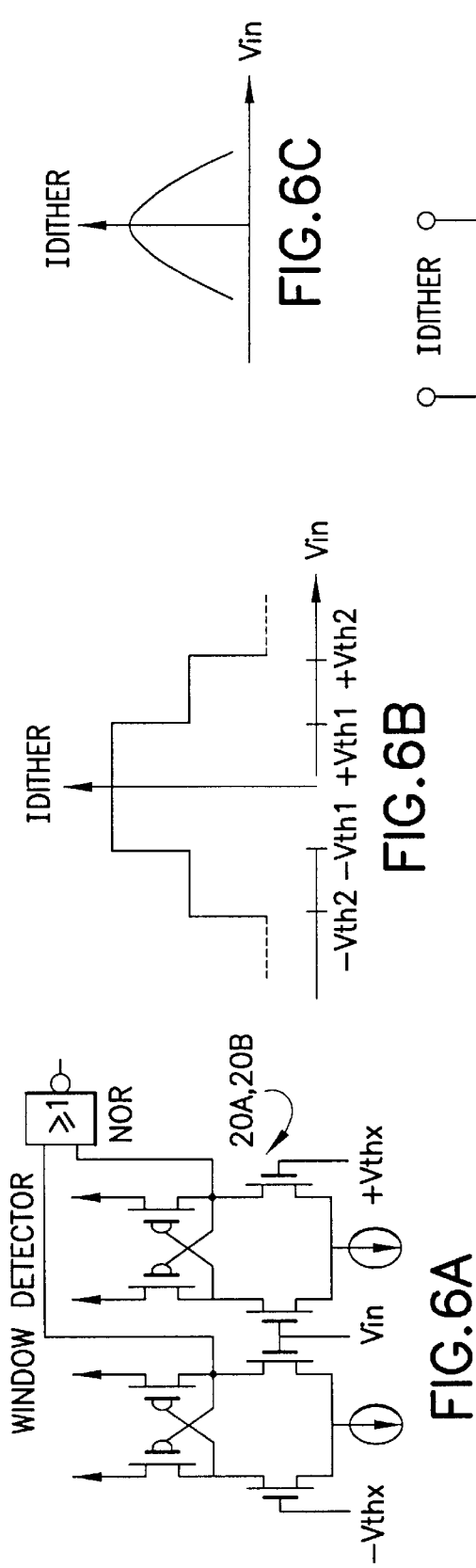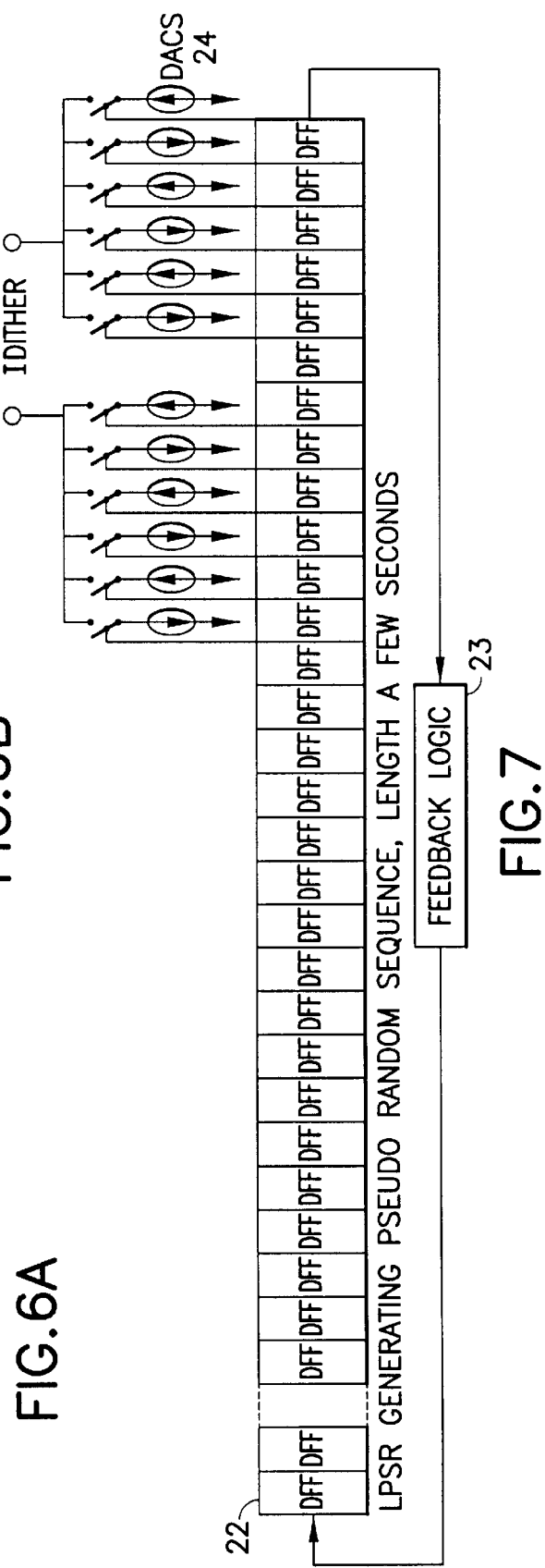

METHOD AND APPARATUS FOR PROVIDING SIGNAL DEPENDENT DITHER GENERATOR FOR SIGMA-DELTA MODULATOR

FIELD OF THE INVENTION

This invention relates generally to sigma-delta (SD) modulators and, more specifically, to SD modulators used in analog-to-digital converter circuitry and that employ a dither signal to improve their performance.

BACKGROUND OF THE INVENTION

SD modulators used in analog-to-digital converters (ADCS) are well known in the art. Reference may be had, by example, to S. R. Norsworthy et al., "Delta-Sigma Data Converters", IEEE Press, NY, 1997, and to J. G. Proakis et al., Digital Signal Processing" Third Edition, Prentice-Hall, 1996.

Conventional SD modulators are known to suffer from the generation of tones, i.e., undesirable signals that manifest themselves as periodic fluctuations, the amplitude and frequency of which are a function of the amplitude and frequency of the input signal. A conventional technique to overcome this problem is to use a dither signal that is added to the input signal. Reference in this regard can be had to U.S. Pat. No. : 5,889,482, "Analog-to-Digital Converter Using Dither and Method for Converting Analog Signals to Digital Signals", by M. Zarubinsky et al. The approach of Zarubinsky et al. is to add in the dither signal in the SD modulator, and to then cancel or suppress the dither signal before it reaches the output terminal of the ADC. This technique is said to preserve a high signal-to-noise ratio (SNR) and to provide low spectral tones in the output signal. If the input signal to the converter has a small amplitude, then the signal at the output of sigma-delta modulator is highly correlated with the dither signal D. If the input signal is close to the maximum admissible amplitude, the modulator partially suppresses the dither signal, and the output signal remains substantially without non-linear distortions.

FIG. 4B of Zarubinsky et al. shows the dither signal D, which can be a multi-level signal with different magnitudes between maximum and minimum values. The magnitude of the dither signal is expressed as $B_D$, which remains constant over one time interval, and where a step index n various randomly.

A disadvantage of the use of the dither signal, in particular one with a constant amplitude, is that the maximum allowable input signal at the input to the SD modulator is reduced as the probability is increased of overloading the quantizer. The end result is a reduction in the dynamic range of the ADC.

A need exists to provide an improved sigma-delta modulator and a dither signal, in particular a switched capacitor (SC) SD modulator, as well as a continuous time SD modulator, where the use of the dither signal does not have an adverse effect on the dynamic range of the ADC, and where the dither signal is generated in a simple manner that makes efficient use of integrated circuit area and that operates with a small power consumption.

OBJECTS AND ADVANTAGES OF THE INVENTION

It is a first object and advantage of this invention to provide an improved sigmadelta modulator.

It is a further object and advantage of this invention to provide an improved sigma-delta modulator that does not suffer from a significant reduction in dynamic range due to the use of a dither signal.

SUMMARY OF THE INVENTION

The foregoing and other problems are overcome and the foregoing objects and advantages are realized by methods and apparatus in accordance with embodiments of this invention.

The teachings of this invention provide embodiments of low complexity, single-bit SD modulators that employ a dither signal having an amplitude that is a function of the amplitude of the input signal to the SD modulator. The teachings of this invention apply as well to multi-bit SD modulators. In these embodiments pseudorandom noise is added to a SD modulator quantizer as a dither current signal, and the amplitude of pseudorandom noise is controlled in such a manner as to be inversely proportional to the amplitude of the input signal, i.e., the amplitude of the dither current signal is smallest when the amplitude of the input signal is largest and vice versa.

In the presently preferred embodiments a plurality of linear feedback shift registers (LFSRS) are used to generate a pseudorandom code sequence that in turn is used to control the output current of simple current steering digital-to-analog converters (DACs), or simple MOS current sources forming a DAC . The output current from a plurality of these DACs is summed to an internal node of the quantizer of the SD modulator.

In a first embodiment of this invention the instantaneous amplitude of the input signal is quantized with a plurality (e.g., two or three) of low complexity window detectors operating in parallel. The bank of window detectors controls the DACs in such a manner that the greater is the absolute value of the input signal the fewer DACs are enabled for operation, and vice versa. In this embodiment the value of the dither signal is pseudorandom, as it is controlled by the LFSRs, and the maximum amplitude of the dither signal is one of a plurality of discrete values, as it is controlled by the bank of window detectors.

In a second embodiment the amplitude of the input signal is squared and subtracted from a constant value, and the difference is used to control the output current of the current steering DACs. In this embodiment the value of the dither signal is again pseudorandom, as it is controlled by the LFSRs, but the maximum amplitude of the dither signal may assume any value within a predetermined continuous range of values, as it is controlled by the squaring-subtracting circuitry.

In both of these embodiments the presence of the dither signal reduces the undesirable tones in the output signal when the tones are most disturbing (i.e., when the input signal is absent or at a low level), while not degrading the performance of the SD modulator when the input signal amplitude is large.

As the dither signal is random or pseudorandom in nature in both of the disclosed embodiments, circuitry that is both simple and inherently inaccurate can be used in the implementation, thereby reducing the required integrated circuit area, circuit complexity and cost, as well as power consumption. These are important considerations when the SD converter, and an ADC, are used in mass produced, battery operated consumer goods, such as handheld cellular telephones and personal communicators.

A method is disclosed to operate a sigma-delta modulator of a type that includes a loop filter followed by a quantizer, as is a sigma-delta modulator that operates in accordance with the method. The method includes steps of (a) sampling an amplitude of an input signal to the loop filter; and (b) generating a dither current signal for summation with a quantizer current signal, where the dither current signal is generated to have a pseudorandom amplitude that is modulated so as to be inversely proportional to the sampled amplitude of the input signal.

The step of generating operates at least one linear feedback shift register to control the on and off states of a plurality of current steering DACs or simple current sources and, hence, the amplitude of the dither current signal, and may further select a polarity of the dither current signal. Also disclosed are techniques for shaping a spectrum of the dither current signal so as to reduce in-band noise.

The step of sampling samples the input signal out of phase with a sampling of the input signal by the sigma-delta modulator.

In one embodiment the step of sampling operates a plurality of window detectors in parallel, and the dither current signal is amplitude modulated in a plurality of predetermined quantized steps that are a function of the number of window detectors.

In another embodiment the step of sampling generates a current with a value that represents a square of the magnitude of the sampled input signal, subtracts the current from a reference current to obtain a difference current, and amplitude modulates the dither current signal using the difference current.

BRIEF DESCRIPTION OF THE DRAWINGS

The above set forth and other features of the invention are made more apparent in the ensuing Detailed Description of the Invention when read in conjunction with the attached Drawings, wherein:

FIG. 6A illustrates the construction of one of the window detectors of the embodiment of FIG. 3;

FIG. 6B shows the quantized, step-wise change in the maximum dither current as a function of the input signal amplitude for the embodiment of FIG. 3;

FIG. 6C shows the continuous change in the dither current for the embodiment of FIG. 3 or FIG. 4; and FIG. 7 illustrates an alternative LFSR configuration for the embodiment of FIG. 4.

DETAILED DESCRIPTION OF THE INVENTION

Figure 1:
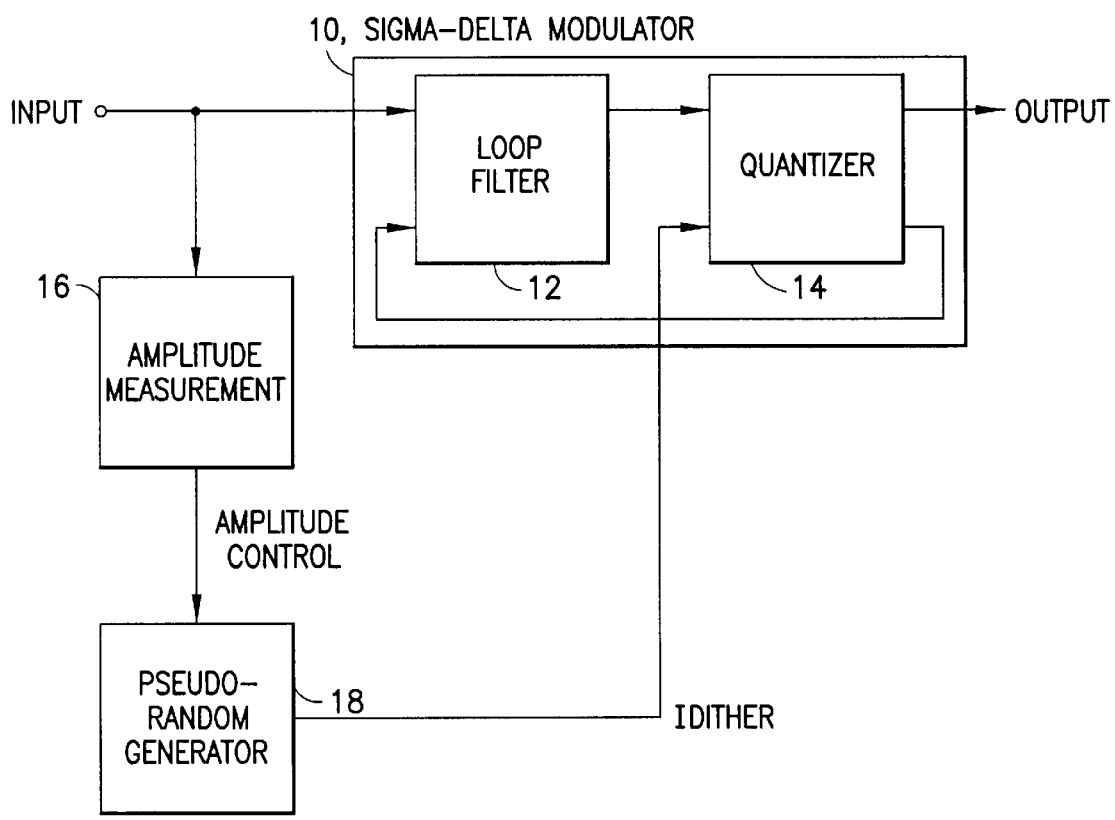
FIG. 1 is a simplified block diagram that depicts an SD modulator together with an input signal dependent pseudorandom dither signal generation circuit for the SD modulator, in accordance with these teachings.
Figure 2:
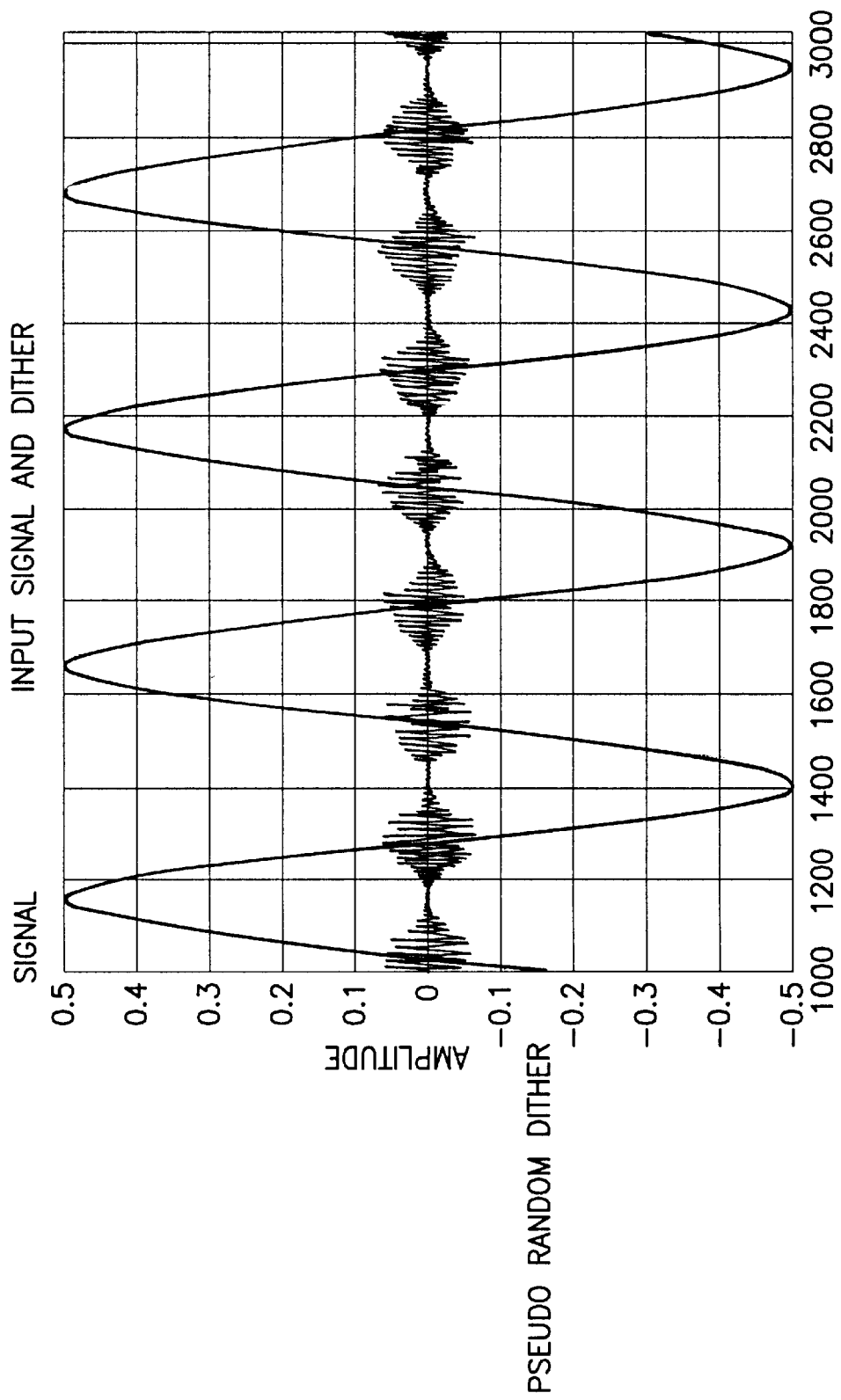
FIG. 2 is a simulated waveform diagram that shows the dither signal generated for a sine wave input signal.

Referring to FIG. 1, there is shown a sigma-delta modulator (SDM) 10 that operates in accordance with the teachings of this invention. The SDM 10 includes an input node for receiving an analog input signal and an output node for outputting a (one bit or a multi-bit) digital output signal. The input signal is applied to a loop filter 12 and from the loop filter to a quantizer 14. The input signal is also applied to an amplitude measurement block 16 that outputs an amplitude control signal to a pseudorandom current generator block 18. The output of the pseudorandom current generator block 18 is a dither current (Idither) that is applied as a second input to the quantizer 14. The effect is to add pseudorandom noise, i.e., a dither signal, at the input of the quantizer 14, where the amplitude of the pseudorandom noise is controlled in such a manner as to be inversely proportional to the amplitude of the input signal. That is, and as can be seen in FIG. 2, the amplitude of the dither signal is smallest when the amplitude of the input signal is largest and vice versa.

Figure 3:
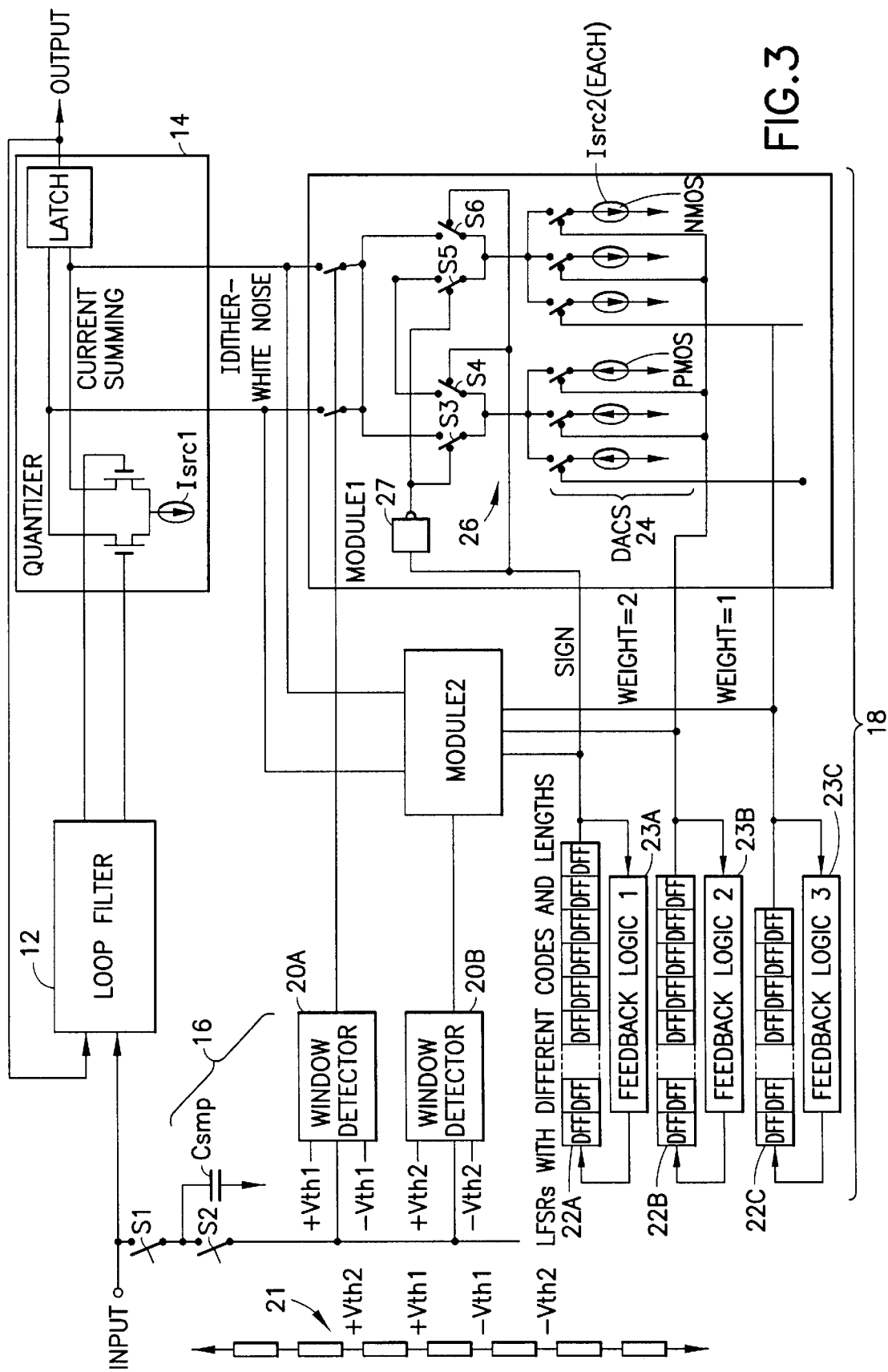
FIG. 3 is a circuit diagram of a first embodiment of a SD modulator that uses an input signal dependent pseudorandom dither signal, wherein the dither signal assumes one of a plurality of discrete amplitude steps.

Turning now to FIG. 3, in a first embodiment of this invention the amplitude measurement block 16 of FIG. 1 is implemented with a sampling capacitor (Csmp) and a plurality of voltage window detectors 20A and 20B. Although two window detectors 20 are shown, more than this number could be used. Also in FIG. 3, the pseudorandom current generator 18 of FIG. 1 is implemented with a plurality of (e.g., three) linear feedback shift registers (LFSRs) 22A, 22B and 22C of different lengths and codes, as well as with a plurality of current steering digital-to-analog converters (DACs) 24 and associated switching logic 26, referred to for convenience as Module 1. Module 1 is controlled by window detector 20A, while the identically constructed Module 2 is controlled by window detector 20B. The sum of the outputs of Modules x (where x=1, 2,. . . , n) is Idither, a current signal that resembles white noise. Idither is applied to the quantizer 14 where it is combined by current summing with the current that results from the output signal of the loop filter 12.

Describing the operation of the embodiment of FIG. 3 now in further detail, the input signal for the dithering circuit is sampled on Csmp. In order to avoid kickback noise from the window detectors 20A, 20B to the SDM 10 the sampling, controlled by switches S1 and S2, occurs at an instant in time when the SDM 10 is not sampling the input signal, i.e., the sampling of the input signal for the dither circuit is out of phase with the SDM sampling. The sampling for the dithering circuit does not need to be accurate, so the value of Csmp can be small. The bank of window detectors 22A, 22B quantizes the amplitude of the sampled input signal (see FIG. 6B). The window detectors 22A, 22B are not required to be accurate, and a small, low current structure composed of two differential transistor pairs with regenerative loads and a nor gate can be used, as is shown in FIG. 6A. The bank of window detectors 22 controls the current steering DACs 24 in Modules 1 and 2 in such a way that the greater is the absolute value of the input signal the fewer is the number of DACs that are enabled, and vice versa. The voltage thresholds (±Vthx) for the window detectors 22A, 22B may be generated with a chain 21 of resistors or diode-connected MOS transistors. The voltage thresholds are not required to be accurate, enabling small structures to be used. In the illustrated embodiment a resistor chain 21 generates four threshold voltages ±Vth1 and ±Vth2, where the narrower voltage range represented by ±Vth1 is applied to window detector 20A, and where the wider voltage range represented by ±Vth2 is applied to window detector 20B. So long as the amplitude of the input signal falls within the range of threshold voltages applied to a given window detector 20A, 20B, the window detector outputs an enabling signal to the associated one of the Modules 1 and 2.

The LFSRs 22A, 22B, 22C that generate the pseudorandom code may be implemented with a chain of data flip-flops (DFFs) and feed back logic 23A, 23B, 23C composed of XOR gates. The code should be sufficiently long, e.g., seconds or fractions of a second, to accommodate the intended application. The number of DFF stages depends on the clock frequency and the desired length of the code, where the longer the code and the higher the clock frequency the greater will be the number of required DFF stages. While the SDM 10 and the LFSRs 22 may be clocked with the same clock frequency, a lower clock frequency could be used for the LFSRs 22 without noticeable adverse effect. The LFSR 22 codes are preferably maximum length codes with a white spectrum. White noise has been found to work well, as it is shaped by the SDM 10 noise transfer function (NTF). However, codes with a colored spectrum (a bandpass or a highpass type of spectrum) may also be employed, as they provide the benefit of reducing dither noise in the signal band. As will be shown in FIG. 7, a single tapped LFSR 22, with multiple taps, can be used to implement a Finite Impulse Response (FIR) filter for the dither signal, and thus shape its noise to reduce the dither noise in the signal band.

In the illustrated example of FIG. 3 the longest LFSR 20A provides an output that controls the sign (plus or minus) of the dither current by controlling the state of switches S3, S4, S5, S6 both directly and through an inverter driver 27. The second longest LFSR 22B is assigned a weight=2, and controls the state (on or off) of two PMOS current sources and two NMOS current sources. The third longest LFSR 22B is assigned a weight=1, and controls the state of one each of the PMOS and NMOS current sources.

Note that the plurality of PMOS and NMOS current sources form the current steering DACs 24. As such, in certain circumstances it may be more appropriate to speak of a specific current source, as opposed to the DAC that the current sources form.

As the current sources that form the current steering DACs 24 are not required to be accurate, they may be composed of minimum size PMOS and NMOS transistor current sources, the values of which are related (by sizing and control voltage) to the value of the current generator used in the quantizer 14 of the SDM 10. For example, in FIG. 3 the current Isrc2=Isrc1/(number of Modules*sum of weights*2*scaling factor), where the scaling factor gives the ratio of the maximum current due to the input signal of the quantizer 14 to the maximum dither current.

In general, the dither signal operates most effectively when the scaling factor is unity, but other values can be selected to adjust the amplitude of the dither signal to a level adequate for the system in which the sigma-delta modulator 10 is operating. The absolute current range of the dither signal is a strong function of the signal bandwidth and the oversampling ratio, and will typically be in a range from tens of nanoamperes to milliamperes.

The end result is the generation of an amplitude modulated dither current signal that resembles white noise, where the amplitude of the dither current signal is inversely proportional to the amplitude of the input signal of interest.

Figure 4:
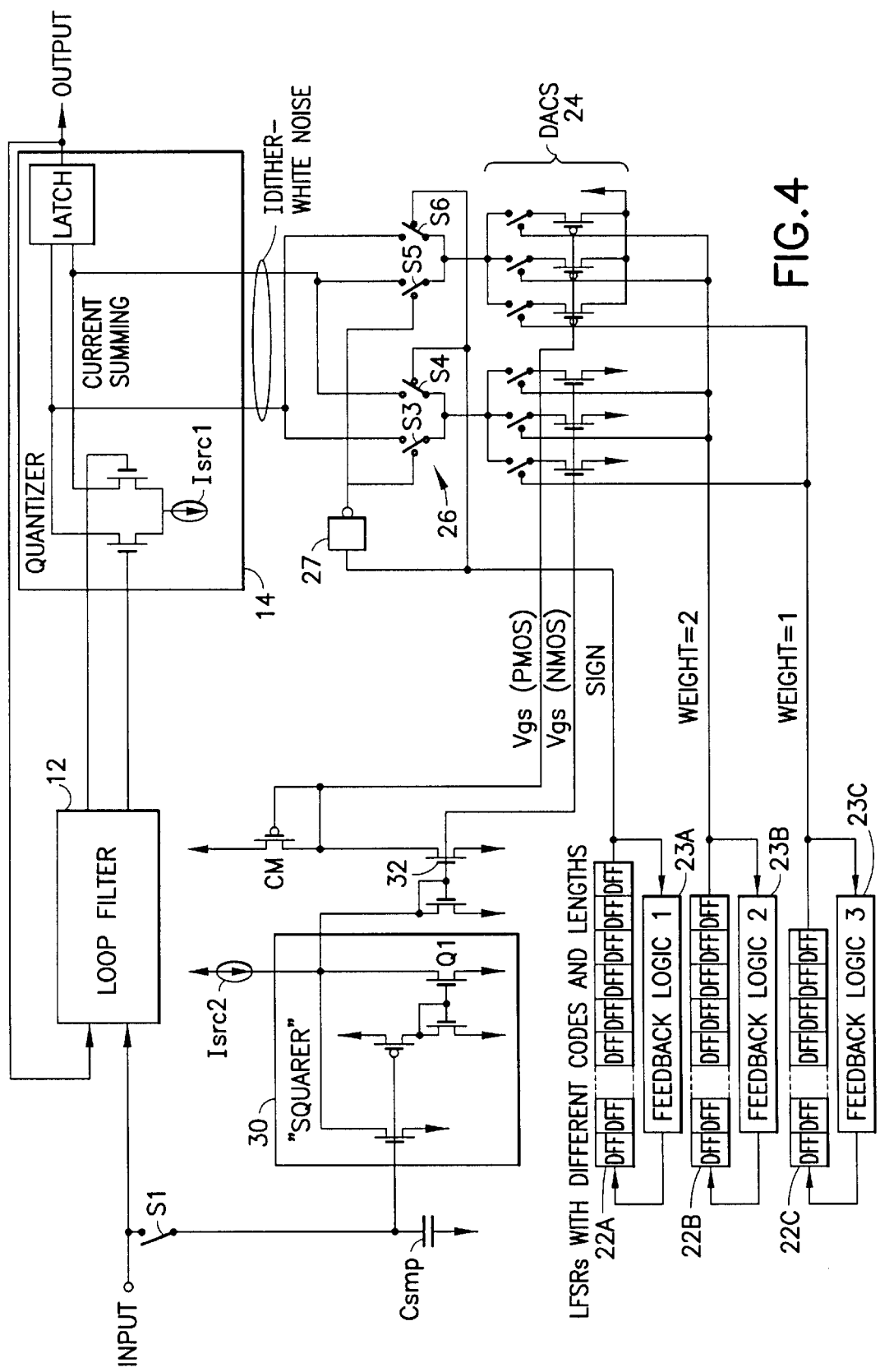
FIG. 4 is a circuit diagram of a second embodiment of a SD modulator that uses an input signal dependent pseudorandom dither signal, wherein the amplitude of the dither signal is controlled over a continuous range of values.

Turning now to the embodiment of FIG. 4, components that are found as well in FIG. 3 are numbered accordingly. FIG. 4 replaces the window detectors 20A and 20B of FIG. 3 with an input signal squaring and differencing circuit 30, and with a chain of current mirrors (CMs) 32 providing current control over the current steering DACs 24 to thereby modulate the amplitude of the dither current.

More particularly, and as in the embodiment of FIG. 3, the input signal for the dithering circuit is sampled on Csmp. In order to avoid kickback noise the sampling, controlled by switch SI, occurs at an instant in time when the SDM 10 is not sampling the input signal, i.e., the sampling of the input signal for the dither circuit is out of phase with the SDM sampling. The sampling for the dithering circuit does not need to be accurate, so the value of Csmp can be small.

The square of the sampled amplitude of the input signal is generated with the squarer circuit 30. The squaring function is not required to be accurate, so a simple structure composed of small devices can be used. The output of the squarer circuitry is a current proportional to the square of the sampled amplitude of the input signal, plus some offset. The amount of offset is not critical, and can be minimized using well-known techniques if desired. The current representing the square of the input magnitude is subtracted from a constant predetermined current (Isrc2) by Q1, and the resulting difference current is fed to the chain of current mirrors 32. The current mirrors 32, via signals Vgs(PMOS) and Vgs(NMOS), are used to control the current of the current sources of the current steering DACs 24. As such, one output of the current mirrors 32 is the signal Vgs (gate to source voltage) for the PMOS current sources of the current steering DACs 24, while a second output of the current mirrors 32 is the signal Vgs for the NMOS current sources of the current steering DACs 24. Controlling the gate to source voltage of the PMOS and NMOS FETs that form the current sources of the current steering DACs 24 serves to control the amount of current that flows through these FETs, and making Vgs a function of the input signal magnitude controls the magnitude of the resulting dither current signal so as to be a function of the magnitude of the input signal, which is a desired result.

In this embodiment the value of the dither current signal is pseudorandom, as it is controlled by the LFSRs 22A, 22B, 22C, and the maximum amplitude of the dither current signal may assume any value within a predetermined continuous range of values (see FIG. 6C), as it is controlled by the squaring-subtracting circuitry.

As in the embodiment of FIG. 3, the current steering DACs 24 are not required to be accurate, and may be implemented using minimum size PMOS and NMOS transistor current sources.

The LFSRs 22A, 22B, 22C generate the pseudorandom code as in the embodiment of FIG. 3. In the example illustrated in FIG. 4, just as in the example of FIG. 3, the longest LFSR 20A provides an output that (pseudorandomly) controls the sign (plus or minus) of the dither current by controlling the state of switches S3, S4, S5, S6 both directly and through the inverter driver 27. The second longest LFSR 22B is assigned a weight=2, and controls the state (on or off) of two PMOS current sources and two NMOS current sources. The third longest LFSR 22B is assigned a weight=1, and controls the state of one each of the PMOS and NMOS current sources.

In this manner, and while the current steering DACs 24 are being pseudorandomly switched in and out, and the sign of the resulting dither current is also being pseudorandomly selected, the squarer and differencing logic 30 and the current mirrors 32 operate to control the magnitude of the current that flows through the current steering DACs 24 in such a manner as to increase the current flow when the magnitude of the input signal decreases, and to decrease the current flow when the magnitude of the input signal increases. The result is the generation of an amplitude modulated dither current signal that resembles white noise, i.e., that is ideally highly uncorrelated with the input signal to the SDM 10.

Figure 5:
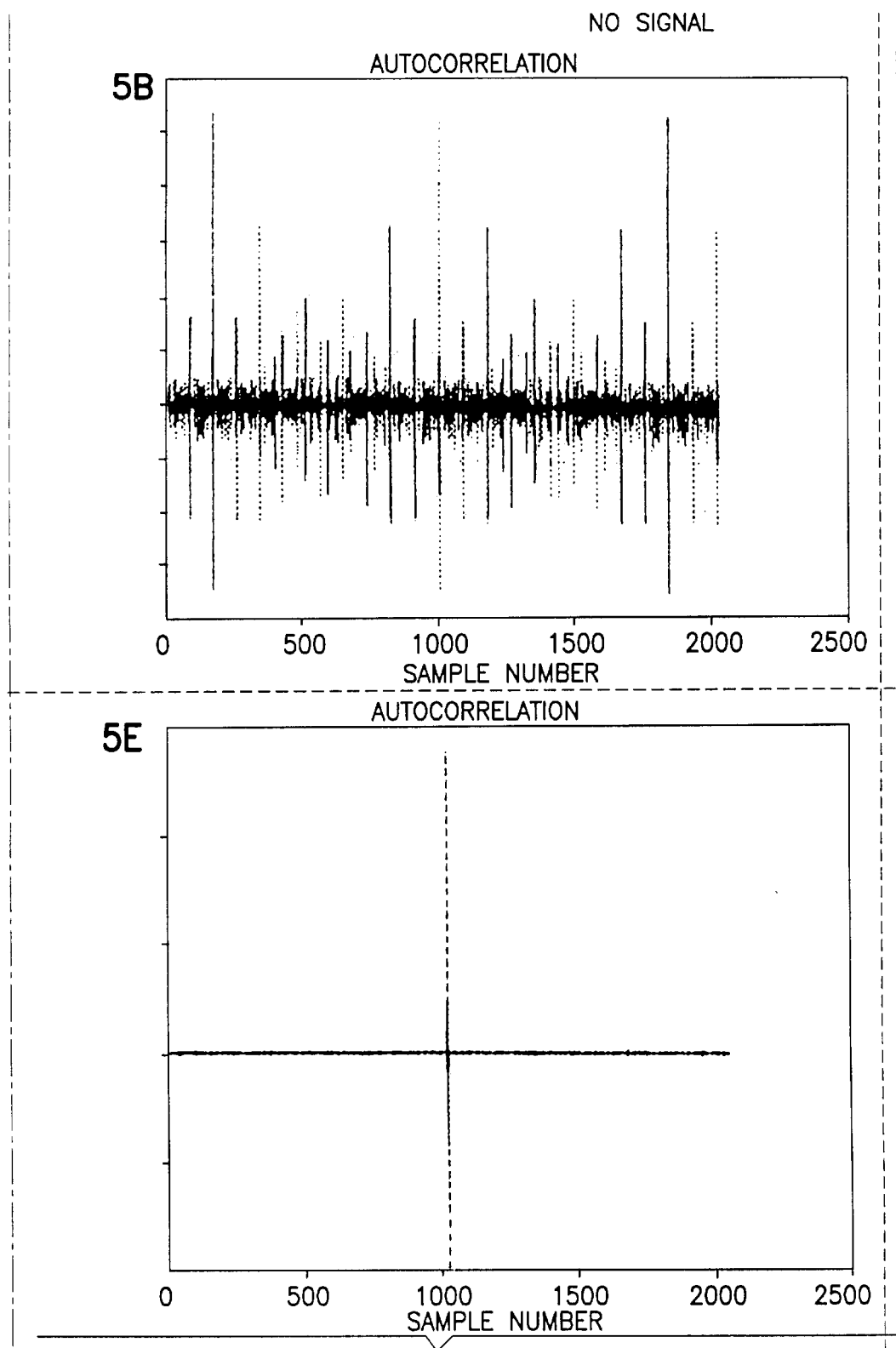
FIG. 5 depicts simulated results of the operation of the second SD modulator embodiment of FIG. 4, with and without the dither signal and the input signal, wherein FIGS. 5A (spectrum) and 5B (autocorrelation) show the output of the SD modulator without the input signal or the dither signal, FIGS. 5D (spectrum) and 5E (autocorrelation) show the same output without the input signal but with the dither signal, and FIGS. 5C (spectrum) and 5F (spectrum) show the output with the input signal and with and without the dither signal.

FIG. 5 shows the simulated results of the operation of the SDM 10 embodiment of FIG. 4, with and without the dither signal and the input signal. FIGS. 5A (spectrum) and 5B (autocorrelation) show the output of the SDM 10 without the input signal or the dither signal. The unwanted tones are clearly evident. FIGS. 5D (spectrum) and 5E (autocorrelation) show the same output without the input signal but with the dither signal. In this case the unwanted tones are clearly absent. FIGS. 5C (spectrum) and 5F (spectrum) show the output with the input signal and with and without the dither signal, where it can be seen that the presence of the dither signal has little effect on the output signal. It is clear that the presence of the dither signal reduces the unwanted tones in the output signal of the SDM 10 when they are most disturbing, i.e., with little or no input signal, but does not appreciably degrade the output signal in the presence of larger input signals. As such, the signal to noise and distortion ratio (SNDR) is improved with small input signals, and the maximum input signal level is not appreciably reduced.

Furthermore, the disclosed embodiments are readily implemented using standard integrated circuit techniques, they require only a modest amount of integrated circuit area, and their power consumption is relatively modest.

It is also pointed out that these teachings apply as well to multi-bit output SDMs, and to both switched capacitor and continuous time sigrna delta modulators.

The disclosed embodiments of this invention beneficially reduce the generation of unwanted tones in the output of the SDM 10, while not reducing the magnitude of the maximum input signal. Furthermore, the disclosed dither signal generation circuits do not adversely impact the operation of the SDM 10, as the input signal sampling is performed in such a manner as to prevent the generation of kickback noise, and the current summation in the quantizer stage 14 does not capacitively load the SDM 10.

While described in the context of LFSRs that generate the pseudorandom signals, other techniques may be employed for generating a random or pseudorandom appearing dither signal.

Furthermore, while described in the context of a plurality of different length and different code LFSRs, with an output bit of each LFSR being used to control the switching state of the current sources of the current steering DACs and the DAC outputs, it can be appreciated that other circuit topologies could be used.

For example, FIG. 7 shows a portion of the embodiment of FIG. 4, wherein the three LFSRs 22A, 22B and 22C are replaced by one longer LFSR 22 and associated feedback logic 23, and where individual current sources of the current steering DACs 24 are selectively turned on and off by individual ones of the taps of the LFSR 22. A similar arrangement can be used as well in the embodiment of FIG. 3.

One significant difference between the embodiments of FIGS. 3 and 7 is in the shaping of their respective output spectra. The spectrum of the multi-bit codes used in the embodiments of FIGS. 3 and 4 is determined solely by the spectra of the individual codes generated by the LFSRs 22A, 22B, 22C, whereas the spectrum of the multi-bit code of the embodiment of FIG. 7 is controlled by the selected tapping scheme as well. For example, in FIG. 7, if the DFFs are tapped as shown, and the multi-bit code is used to control consecutive PMOS and NMOS transistors, the configuration effectively forms the FIR filter that exhibits an impulse response of −1,1,−1,1,−1,1 (which may or may not be particularly useful for a given application), and the spectrum of the code obtained from the LFSR 22 is shaped accordingly. This, or some other tapping schemes, can thus be used to shape the spectrum as desired, and can be used to advantage in many applications. Furthermore, the configuration illustrated in the embodiment of FIG. 7 is somewhat less complex than the embodiments shown in FIGS. 3 and 4, where multiple, shorter LFSRs 22 are used. The embodiments shown in FIGS. 3 and 4 may, however, be more practical if a multi-bit code with a white spectrum is desired. In this case the individual codes of the separate LFSRs 22A, 22B and 22C are selected to exhibit a white spectrum.

Note should be made of the fact that while certain of the drawing Figures depict a single-ended circuit configuration, a differential configuration could be employed as well.

Thus, while the invention has been particularly shown and described with respect to preferred embodiments thereof, it will be understood by those skilled in the art that changes in form and details may be made therein without departing from the scope and spirit of the invention.

What is claimed is:

1. A method to operate a sigma-delta modulator of a type that includes a loop filter followed by a quantizer, comprising steps of:

sampling an amplitude of an input signal to the loop filter; and generating a dither current signal for summation with a quantizer current signal, said dither current signal being generated to have a pseudorandom amplitude that is modulated so as to be inversely proportional to the sampled amplitude of the input signal and to exhibit a non-white frequency spectrum that is selected to reduce the generation of noise in the signal band of interest.

2. A method as in claim 1, wherein the step of generating operates at least one linear feedback shift register to control the on and off states of a plurality of current sources forming a DAC for controlling the amplitude and the frequency spectrum of the dither current signal.

3. A method as in claim 2, wherein the step of operating the at least one linear feedback shift register further selects the polarity of the dither current signal.

4. A method to operate a sigma-delta modulator of a type that includes a loop filter followed by a quantizer, comprising steps of:

sampling an amplitude of an input signal to the loop filter; and generating a dither current signal for summation with a quantizer current signal, said dither current signal being generated to have a pseudorandom amplitude that is modulated so as to be inversely proportional to the sampled amplitude of the input signal, wherein the step of generating operates at least one linear feedback shift register to control the on and off states of a plurality of current sources forming a DAC and to control the amplitude of the dither current signal, and wherein the step of operating the at least one linear feedback shift register operates a linear feedback shift register having a plurality of taps for implementing a FIR filter to shape the spectrum of the dither current signal.

5. A method to operate a sigma-delta modulator of a type that includes a loop filter followed by a quantizer, comprising steps of:

sampling an amplitude of an input signal to the loop filter; and generating a dither current signal for summation with a quantizer current signal, said dither current signal being generated to have a pseudorandom amplitude that is modulated so as to be inversely proportional to the sampled amplitude of the input signal, wherein the step of sampling samples the input signal for dither signal amplitude control out of phase with a sampling of the input signal by the sigma-delta modulator.

6. A method to operate a sigma-delta modulator of a type that includes a loop filter followed by a quantizer, comprising steps of:

sampling an amplitude of an input signal to the loop filter; and generating a dither current signal for summation with a quantizer current signal, said dither current signal being generated to have a pseudorandom amplitude that is modulated so as to be inversely proportional to the sampled amplitude of the input signal, wherein the step of sampling samples the input signal for dither signal amplitude control by operating a plurality of window detectors in parallel, and wherein the dither current signal is amplitude modulated in a plurality of predetermined quantized steps that are a function of the number of window detectors.

7. A method to operate a sigma-delta modulator of a type that includes a loop filter followed by a quantizer, comprising steps of:

sampling an amplitude of an input signal to the loop filter; and generating a dither current signal for summation with a quantizer current signal, said dither current signal being generated to have a pseudorandom amplitude that is modulated so as to be inversely proportional to the sampled amplitude of the input signal, wherein the step of sampling samples the input signal for dither signal amplitude control by generating a current having a value that represents a square of the magnitude of the sampled input signal, subtracts the current from a reference current to obtain a difference current, and amplitude modulates the dither current signal using the difference current.

8. A sigma-delta modulator of a type that includes a loop filter followed by a quantizer, comprising:

circuitry for sampling an amplitude of an input signal to the loop filter; and circuitry for generating a dither current signal for summation with a quantizer current signal, said dither current signal being generated to have a pseudorandom amplitude that is modulated so as to be inversely proportional to the sampled amplitude of the input signal and to exhibit a non-white frequency spectrum that is selected to reduce the generation of noise in the signal band of interest.

9. A sigma-delta modulator as in claim 8, wherein said dither current signal generating circuitry comprises at least one linear feedback shift register to control the on and off states of a plurality of current sources forming a DAC for controlling the amplitude and the frequency spectrum of the dither current signal.

10. A sigma-delta modulator as in claim 9, wherein said at least one linear feedback shift register further selects the polarity of the dither current signal.

11. A sigma-delta modulator of a type that includes a loop filter followed by a quantizer, comprising:

circuitry for sampling an amplitude of an input signal to the loop filter; and circuitry for generating a dither current signal for summation with a quantizer current signal, said dither current signal being generated to have a pseudorandom amplitude that is modulated so as to be inversely proportional to the sampled amplitude of the input signal, wherein said dither current signal generating circuitry comprises at least one linear feedback shift register to control the on and off states of a plurality of current sources forming a DAC and the amplitude of the dither current signal, and wherein said dither current signal generating circuitry comprises a linear feedback shift register having a plurality of taps for implementing a FIR filter to shape the spectrum of the dither current signal.

12. A sigma-delta modulator of a type that includes a loop filter followed by a quantizer, comprising:

circuitry for sampling an amplitude of an input signal to the loop filter; and circuitry for generating a dither current signal for summation with a quantizer current signal, said dither current signal being generated to have a pseudorandom amplitude that is modulated so as to be inversely proportional to the sampled amplitude of the input signal, wherein said sampling circuitry samples the input signal for dither signal amplitude control out of phase with a sampling of the input signal by the sigma-delta modulator.

13. A sigma-delta modulator of a type that includes a loop filter followed by a quantizer, comprising:

circuitry for sampling an amplitude of an input signal to the loop filter; and circuitry for generating a dither current signal for summation with a quantizer current signal, said dither current signal being generated to have a pseudorandom amplitude that is modulated so as to be inversely proportional to the sampled amplitude of the input signal, wherein said sampling circuitry comprises a plurality of window detectors operated in parallel, and wherein the dither current signal is amplitude modulated in a plurality of predetermined quantized steps that are a function of the number of window detectors.

14. A sigma-delta modulator of a type that includes a loop filter followed by a quantizer, comprising:

circuitry for sampling an amplitude of an input signal to the loop filter; and circuitry for generating a dither current signal for summation with a quantizer current signal, said dither current signal being generated to have a pseudorandom amplitude that is modulated so as to be inversely proportional to the sampled amplitude of the input signal, wherein said sampling circuitry comprises circuitry for generating a current having a value that represents a square of the magnitude of the sampled input signal, circuitry for subtracting the current from a reference current to obtain a difference current, and circuitry for amplitude modulating the dither current signal using the difference current.

15. A method for operating a sigma-delta modulator having a quantizer, comprising steps of:

inputting a signal to the sigma-delta modulator; and generating a dither signal for injection into a quantizer input signal, said dither signal being generated to have a pseudorandom amplitude that is modulated so as to be inversely proportional to the amplitude of the input signal to the sigma-delta modulator; wherein said step of generating includes a step of shaping a spectrum of the dither signal so as to reduce in-band noise.

16. A method as in claim 15, wherein said step of generating comprises a step of operating at least one linear feedback shift register having a plurality of taps selected for implementing a FIR filter that shapes the spectrum of the dither signal.

17. A sigma-delta modulator, comprising a quantizer;

an input node for inputting a signal to the sigma-delta modulator; and circuitry for generating a dither signal for combination with a quantizer input signal, said dither signal being generated to have a pseudorandom amplitude that is modulated so as to be inversely proportional to the amplitude of the input signal to the sigma-delta modulator, said circuitry operating to shape a spectrum of the dither signal so as to reduce in-band noise.

18. A sigma-delta modulator as in claim 17, wherein said circuitry comprises at least one linear feedback shift register having a plurality of taps selected for implementing a FIR filter that shapes the spectrum of the dither signal.

19. a sigma-delta modulator as in claim 17, wherein said circuitry comprises a plurality of linear feedback shift registers (LFSRs), wherein an output of a first one of the plurality of LFSRs determines a polarity of the dither signal, and wherein other ones of the plurality of LFSRs form a set of weighted LFSRs whose outputs, when combined, pseudorandomly modulate the amplitude of a current used in generating said dither signal.

* * * * *